United States Patent
Collongues

(10) Patent No.: US 11,243,242 B2
(45) Date of Patent: Feb. 8, 2022

(54) SYSTEM FOR TESTING A RAILWAY TRACTION BLOCK

(71) Applicant: ALSTOM Transport Technologies, Saint-Ouen (FR)

(72) Inventor: Laurent Collongues, Orleix (FR)

(73) Assignee: ALSTOM Transport Technologies, Saint-Ouen (FR)

( * ) Notice: Subject to any disclaimer, the term of this patent is extended or adjusted under 35 U.S.C. 154(b) by 237 days.

(21) Appl. No.: 16/209,751

(22) Filed: Dec. 4, 2018

(65) Prior Publication Data
US 2019/0170800 A1 Jun. 6, 2019

(30) Foreign Application Priority Data
Dec. 5, 2017 (FR) .................................. 17 61638

(51) Int. Cl.
*G01R 31/62* (2020.01)
*G01R 31/00* (2006.01)
(Continued)

(52) U.S. Cl.
CPC .......... *G01R 31/008* (2013.01); *G01M 17/08* (2013.01); *G01R 31/1227* (2013.01); *B60L 5/18* (2013.01);
(Continued)

(58) Field of Classification Search
CPC .. G01R 31/008; G01R 31/1227; G01R 31/58; G01R 31/62; G01M 17/08; B60M 3/04
(Continued)

(56) References Cited

U.S. PATENT DOCUMENTS

| 9,664,716 B1* | 5/2017 | Zelm ...................... G01R 31/52 |
| 2011/0133749 A1* | 6/2011 | Werle .................. G01R 31/1227 324/537 |

(Continued)

FOREIGN PATENT DOCUMENTS

| DE | 19645335 A1 | 5/1998 |
| JP | S5666729 A | 6/1981 |
| WO | 2009/149866 A1 | 12/2009 |

OTHER PUBLICATIONS

Winter A. et al. "A mobile transformer test system based on a stativ frequency converter", XV Internationsaylm Posiuom on High Voltage Engineering, University of Jubljana, Elektroinsitut Milan Vidmar, Ljublana, Slovenia, Aug. 27-31, 2007, Sep. 4, 2007 (Sep. 4, 2007), pp. 1-6, XP002500564, Extrait de l'Internet: URL:http://www.ish2007.org/pdf/aWinter.pdf [extrait le Oct. 20, 2008].
(Continued)

*Primary Examiner* — Huy Q Phan
*Assistant Examiner* — Courtney G McDonnough
(74) *Attorney, Agent, or Firm* — Knobbe, Martens, Olson & Bear, LLP

(57) ABSTRACT

A system for testing a traction block, such as a railway traction block, includes two zones that are physically separated from one another, an operational zone located in a container and divided into at least two parts. One part is a command part accessible by an operator during testing, and the other part is a high-voltage part inaccessible during testing. The system also includes a test zone located outside the container, and configured to receive the traction block to be tested. The test zone is able to be supplied with electricity during the test by the operational zone using dedicated connections.

11 Claims, 2 Drawing Sheets

(51) Int. Cl.
*G01R 31/12* (2020.01)
*G01M 17/08* (2006.01)
*B60L 5/18* (2006.01)
*B60M 3/04* (2006.01)
*G01R 31/58* (2020.01)

(52) U.S. Cl.
CPC ............ *B60L 2200/26* (2013.01); *B60M 3/04* (2013.01); *G01R 31/58* (2020.01); *G01R 31/62* (2020.01)

(58) Field of Classification Search
USPC ................. 246/169 R, 31–34 R; 73/620–639
See application file for complete search history.

(56) References Cited

U.S. PATENT DOCUMENTS

2014/0240901 A1* 8/2014 Steiger .................... H02B 1/26
 361/620
2017/0259834 A1* 9/2017 Audemar ........... H05K 7/20927

OTHER PUBLICATIONS

Search Report for French Application No. FR1761638, dated Aug. 17, 2018, in 2 pages.
Written Opinion for French Application No. FR1761638 in 5 pages.

\* cited by examiner

SYSTEM FOR TESTING A RAILWAY TRACTION BLOCK

FIELD OF THE INVENTION

The present invention relates to a system for testing a traction block, preferably a railway traction block, comprising two zones that are physically separated from one another.

The invention also relates to a method for testing a railway traction block.

The invention also relates to an associated computer program product.

BACKGROUND OF THE INVENTION

Currently, systems (or platforms) exist for testing railway traction blocks (or traction boxes) that are installed on an operating site and validated locally. "Testing system" hereinafter refers to a system capable of electrically testing a railway traction block, whether in terms of:

dielectric testing through insulation/electrical continuity tests of the traction block, low-voltage relay testing to verify the compliance of the low-voltage operation of the railway traction block, testing of the auxiliary network making it possible to verify the proper operation of the electrical power supply necessary to implement functions used on an auxiliary basis such as ventilation, compression, passenger services, etc., provided within a railway vehicle.

The transfer of such testing systems onto another production/exploitation site for railway blocks requires a disassembly, reassembly and revalidation on the new production/exploitation site. The associated cost and transfer time are therefore high and sometimes prohibitive.

Furthermore, for safety reasons, existing test systems are not always capable of also carrying out a high-voltage test of the railway traction block, to verify the proper operation of the traction chain during movement of the railway vehicle.

SUMMARY OF THE INVENTION

One aim of the present invention is to propose an alternative testing system capable of performing the same types of tests as the traditional testing systems, including high-voltage tests, while allowing them to be secured and making it possible to optimize their cost and the transfer time of the testing system between two separate production/exploitation sites.

To that end, the invention relates to a system for testing a traction block, preferably a railway traction block, comprising two zones that are physically separated from one another:

an operational zone located in a container and divided into at least two parts:
  a first command part accessible by an operator during testing,
  a second high-voltage part inaccessible during testing,
a test zone, located outside the container, and configured to receive the traction block to be tested,
the test zone being able to be supplied with electricity during the test by the operational zone using dedicated connections.

According to specific embodiments of the invention, the system for testing a traction block also has one or more of the following features, considered alone or according to any technically possible combination(s):

the first command part comprises a testing controller capable of testing the traction block according to at least four successive separate test phases comprising a dielectric test phase and the following voltage test phases:
  low voltage,
  auxiliary voltage,
  high voltage,
each test phase being associated with a voltage supply source of the separate test zone, each supply source delivering a high voltage being located in the second high-voltage part of the container;

the second high-voltage part comprises at least one gate capable of supporting the fastening of high-voltage equipment comprising at least a plurality of separate supply voltage sources;

the container comprises at least four separate operator access doors, the first command part comprising at least one door, the second high-voltage part of the container comprising at least three doors, at least one of which allows access to an electrical cabinet, and two of which are interleaved, with different sizes and allowing access to the space of the high-voltage part of the container comprising the sources and/or voltage supply charges, and wherein the test zone comprises at least one operator access door, at least one access door of the testing system being secured by a system of keys comprising a plurality of locks distributed over at least two separate pieces of test equipment of the testing system;

the container comprises at least one system for regulating the temperature;

the system further comprises a device for protecting the test zone, the protection device comprising a plurality of partitions and/or a plurality of virtual safety barriers;

the test zone comprises a portion of a traction block production line, the portion being capable of supporting a traction block;

the test controller is capable of triggering each test phase after detecting the closing of the door(s) of the test zone authorizing the activation of the associated voltage supply source, the closing of the operator access door of the test zone making it possible to release a first key necessary for the validation by the controller of the triggering of the voltage test phases;

to trigger the high-voltage test phase, the first key is necessary to unlock a second key supported by a first set of locks located in the first control part of the operational zone, the second key is necessary to unlock a first safety switch for activating the high-voltage supply source, the position change of which releases a third key for unlocking a fourth key supported by a second set of keys, the fourth key being connected to a fifth key for validating the command of the controller activating the high-voltage source located in the second high-voltage part that is inaccessible during testing;

the first set of keys bears, on one of its locks, a sixth key free to use in the absence of the first key on the associated lock of the first set of locks, and the testing system comprises a third set of locks located on the distribution cabinet of the second high-voltage part of the container comprising four locks, including:
  a lock dedicated to the sixth key,
  two other locks from the third set of locks being dedicated to a seventh and an eighth key able to be obtained respectively after actuating two voltage breakers in the inactive position of the distribution cabinet, and
  a fourth lock in which a ninth key is inserted and able to be released only in the presence of the sixth, seventh and eighth keys, the ninth key being able to open the smallest of the two interleaved portions for accessing the space of the high-voltage part of the container comprising the voltage supply sources.

The invention further relates to a method for testing a traction block as defined above, comprising at least four successive separate test phases comprising a dielectric test phase and the following voltage test phases:
   low voltage,
   auxiliary voltage,
   high voltage,
each test phase being associated with a separate voltage supply source of the separate test zone, the high-voltage supply source(s) being located in the second high-voltage part of the container, in particular in the dedicated area of the second high-voltage part accessible only through the door secured by the system of keys previously described so that the person cannot enter when the second high-voltage part is under voltage during the high-voltage test phase.

The invention also relates to a computer program product including software instructions which, when implemented by an information processing unit integrated into a test controller located in the testing system according to the invention implements a testing method as defined above.

BRIEF DESCRIPTION OF THE DRAWINGS

Other features and advantages of the invention will appear upon reading the following description, provided solely as an example and done in reference to the appended drawings, in which.

DETAILED DESCRIPTION OF THE PREFERRED EMBODIMENTS

Figure 1:
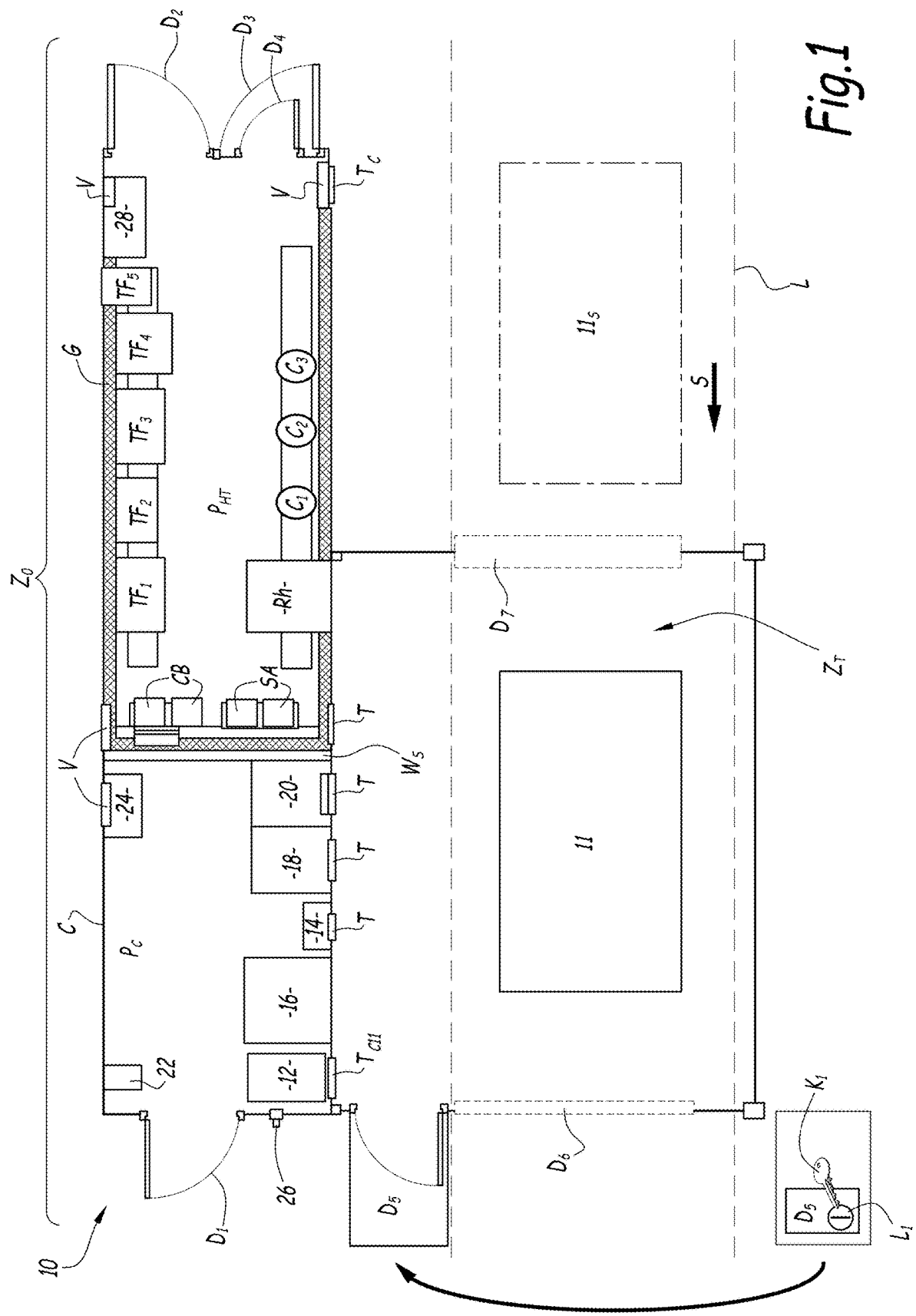
FIG. 1 is a schematic view of an example system for testing a railway traction block according to the invention.

In the example embodiment of FIG. 1, the system 10 for testing a railway traction block comprises, according to the invention, two zones $Z_O$ and $Z_T$ physically separated from one another:
   an operational zone $Z_O$ located in a container C and divided into at least two parts:
      a first command part $P_C$ accessible by an operator during testing,
      a second high-voltage part $P_{HT}$ inaccessible during testing,
   a test zone $Z_T$, located outside the container C, and configured to receive the railway traction block 11 to be tested (also called traction box),
the test zone $Z_T$ being able to be supplied with electricity during the test by the operational zone $Z_O$ using dedicated connections, not shown.

In other words, according to the present invention, the operational zone $Z_O$ is easily movable within a container C and only requires a certification (validation) step when it leaves the plant and no later certification when the testing system is transferred to different production and/or exploitation sites of railway traction blocks. More specifically, once certified, the operational zone $Z_O$ corresponding to a container is associated with a certificate of navigability, which makes it transferable anywhere in the world, which, relative to the disassembly/reassembly and validation of traditional testing systems, represents a time savings of about 50% to test a traction block, since the validation time of the testing system is saved, and an estimated labor savings of two hundred thirty to two hundred fifty thousand euros per transfer.

Such a container C for example corresponds to a forty foot container measuring 12.020 m by 2.235 m, the first command part $P_C$ for example having a length of 4.413 m and the second high-voltage part $P_{HT}$ for example having a length of 7.723 m.

The first command part $P_C$ of the operational zone $Z_O$, physically corresponding to the container C, comprises a plurality of pieces of test equipment for example comprising a test controller 12 capable of electrically testing the railway traction block, a dielectric station 14, a control console 16, a grounding switch for the test phases 18 capable of activating/deactivating the voltage source(s) associated with each test phase, an interface cabinet 20 with the traction block (or traction box), a temperature regulator 22, for example, an air conditioner and according to one particular aspect, a reversible air conditioner convertible into a dehumidifier to regulate the temperature of the container C in case of climate hazard, a safety box 24 near which one or several ventilation hatches V are arranged in the container in order to regulate the temperature within the container C, and one or several connection hatches T allowing the connection of one or several connections, not shown, to the test zone $Z_T$.

The first command part $P_C$ of the container C further comprises an operator access door $D_1$, which may or may not be associated with an operation gate of equal size, and an emergency pushbutton 26 located on an outer face of the container C, for example near the operator access door $D_1$, for immediate powering off of the entire container C.

The second high-voltage part $P_{HT}$ of the container C is isolated from the first command part $P_C$ of the container C in particular using a separating wall $W_S$. This wall $W_S$ is electrically insulating.

Furthermore, the second high-voltage part $P_{HT}$ of the container C comprises, on one or several of its inner walls, at least one gate G capable of supporting the fastening of high-voltage equipment comprising at least a plurality of separate supply voltage sources.

The use of such gates G for positioning electrical supply equipment makes it possible no longer to use an electrical cabinet and therefore allows lightening of the weight of the container, saved space and financial savings.

This equipment in particular includes:
   a plurality of high-voltage transformers $TF_1$, $TF_2$, $TF_3$, $TF_4$, $TF_5$ capable of respectively delivering distinct high-voltage values, for example 750 Vdc, 1500 Vdc, 3 kVdc, 1000 V/50 Hz and 1000 V/16 Hz 2/3,
   charges $C_1$, $C_2$, $C_3$ corresponding to resistances, inductances, capacitor, converters, etc., these charges being able to allow the simulation of an actual engine speed,
   a rheostat able to allow the simulation of a braking situation of the traction block,
   circuit breakers CB,
   line inductances SA,
   etc.

Furthermore, like the first command part $P_C$, the second high-voltage part $P_{HT}$ of the container C also has one or several ventilation hatches V and one or several connection hatches T, $T_C$, $T_{C11}$ to the test zone $Z_T$.

The second high-voltage part $P_{HT}$ of the container C is also provided with test equipment corresponding to a distribution cabinet 28 comprising one or several breakers supplying power to the aforementioned transformers TF. In other words, the container C is supplied with three-phase 400 V or 480 Vac power at the distribution cabinet 28 having two dedicated breakers as shown hereinafter in connection with FIG. 4.

Furthermore, the second high-voltage part $P_{HT}$ of the container C is also able to be connected, via the connection hatch $T_C$, to a communication network via a dedicated connector, for example a connector of the RJ45 type, so as to have an Internet connection in the container C. Furthermore, the communication with the traction box 11 is also done via an RJ45-type connector via the connection hatch $T_{C11}$. The second high-voltage part $P_{HT}$ of the container C comprises, for example at the end opposite the separating wall $W_S$ with the first command part $P_C$ of the container C, at least three doors $D_2$, $D_3$ and $D_4$, including two interleaved doors $D_3$ and $D_4$ with different sizes, for accessing the area of the high-voltage part $P_{HT}$ of the container C comprising the voltage supply sources and/or charges. The doors $D_2$ and $D_3$ are used to bring heavy and bulky material in or out. The door $D_4$ is a service door intended for operators to go in and out.

The test zone $Z_T$ is able to receive the traction block 11 to be tested and comprises at least one operator access door $D_5$, the closing of which is able to be locked using a first lock S1 and an associated first key K1.

According to a first possible installation according to the invention, the test zone $Z_T$ comprises, according to the presence of virtual barriers or partitions, a second and a third door D6 and D7 allowing the entry and removal of the traction block 11 to be tested.

According to a second possible installation according to the invention, the test zone $Z_T$ comprises a portion of a railway traction block production line L, the portion being capable of supporting a traction block 11.

According to this second installation, the production line L is able to allow the movement of the traction blocks to be tested along the direction S, for example via a conveyor belt, so as to go to the following test of the following traction block $11_S$.

According to an aspect that is not shown, the test system 10 according to the invention further comprises a device for protecting the test zone $Z_T$, the protection device comprising a plurality of partitions and/or a plurality of virtual safety barriers. Such virtual barriers used to protect the test zone for example correspond to optoelectronic presence detection elements able to detect the presence of an object or a person in their detection field.

Furthermore, according to one particular aspect, such barriers also make it possible to turn the test zone $Z_T$ into an assembly zone of the traction block 11, for example.

According to the example of FIG. 1, the operator access door $D_5$ to the test zone $Z_T$ and the smallest operator access door $D_4$ are secured during testing by locking using locks specific to them.

In other words, according to this particular aspect, each operator access door $D_5$ and $D_4$ of the test system is secured by a system of keys.

Figure 2:
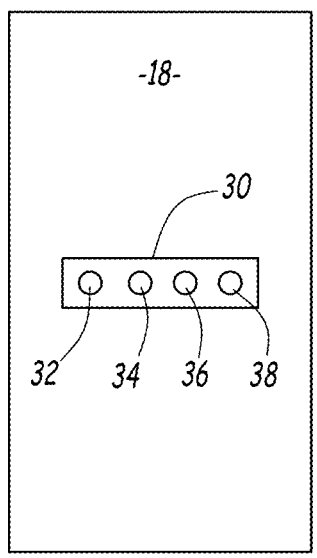
FIG. 2 is a schematic view of a front face part of a switch for grounding test phases to be implemented according to the invention.
Figure 3:
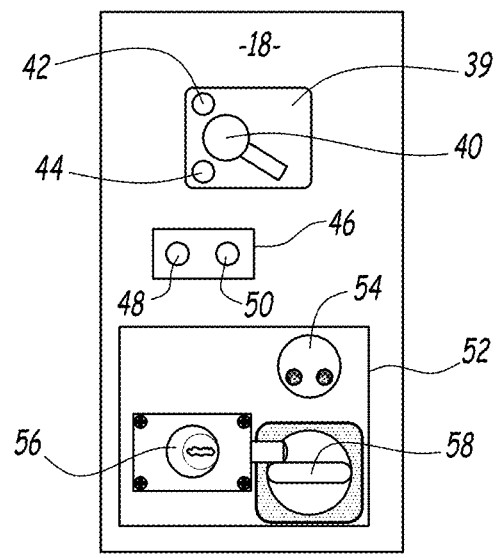
FIG. 3 is a schematic view of another front face part of the switch of FIG. 2 for grounding test phases to be implemented.
Figure 4:
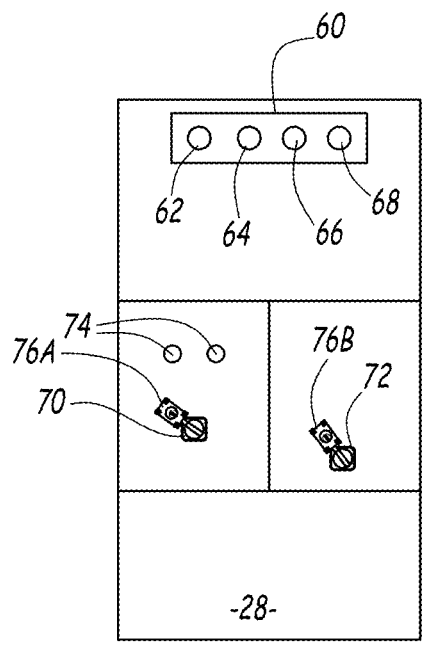
FIG. 4 is a schematic view of an electrical distribution cabinet, FIG. 5 schematically illustrates the testing method implemented according to the present invention.

Such a system of keys and the securing of the electrical tests that it is able to carry out is described in more detail below in connection with FIGS. 2 to 4 respectively illustrating a schematic view of two front face parts of the grounding switch of the test phases 18 to be implemented, and the electrical distribution cabinets 28 of the container C.

More specifically, the grounding switch of the test phases 18 of the first command part $P_C$ has, for example on its visible front face accessible to an operator present in the test zone $Z_T$, a first assembly 30 (or base) with at least four locks 32, 34, 36, 38. In the initial configuration, for example before any voltage test on the traction block 11, said first assembly 30 with four locks 32, 34, 36, 38 bears two keys, not shown, K0 and K2 captive in the locks 32 and 34, respectively, the lock 36 is free of any key and intended to receive the key K1 obtained after closing the door $D_5$ of the test zone $Z_T$, and the lock 38 bears a key, not shown, K6 free to use without the key K1 on the lock 36 and captive otherwise.

The grounding switch 18 of the test phases to be implemented comprises at least three separate locking/unlocking blocks.

A first locking/unlocking block 39 comprises a first switch 40 making it possible to go from a "ground" mode to a "service" mode making it possible to unlock a first bolt for triggering the high-voltage engagement of the second high-voltage part $P_{HT}$ of the container C during the activation of a high voltage test phase of the traction block 11. The first locking/unlocking block 39 also comprises two locks 42 and 44, the lock 42 bearing a key K3 that is captive when there is no key on the lock 44, the lock 44 being associated with the key K2 captive on the first assembly 30 when there is no key K1 releasable from the lock S1 by closing the door D5 for accessing the test zone $Z_T$.

After placing the key K2 in the lock 44, the key K3 is freed, which further makes it possible to actuate the switch 40 so as to go from the "ground" mode to the "service" mode.

The second locking/unlocking block 46 corresponds to a second set of locks comprising at least two locks 48 and 50, the lock 48 is free in the initial configuration and able to receive the key K3 once the latter is freed from the first locking/unlocking block 39. The lock 50 bears a key K4 that is captive when the key K3 is not present in the lock 48. This key K4 is in turn connected by a connecting ring such as a broken key ring, a carabiner, etc., to a key K5. Such a key K5 is able to allow the activation of the high-voltage sources of the second high-voltage part $P_{HT}$ of the container C in particular after placement in a lock, not shown, for example present on the control console 16 or on the test controller 12 of the first command part $P_C$ of the operational zone $Z_O$ of the container C.

The third locking/unlocking block 52 comprises a set 54 of lighted indicators for example made up of three LEDs of different colors associated with the operation of the first switch 40, a lock 56 able to constrain a second switch 58 in a first predetermined position corresponding to the inactivation of an auxiliary voltage source and in a second position to allow the movement of the switch 58 into a second position activating the auxiliary voltage source.

In particular, the lock 56 in the initial configuration is free and does not bear any key and is able to receive the key K0 freed from the lock 32 of the first assembly 30 of four locks in the presence of the key K2 obtained after closing the door D5 for operator access to the test zone $Z_T$.

The electrical distribution cabinet 28 located in the high-voltage part $P_{HT}$ of the container C comprises a third assembly 60 (or base) with at least four locks 62, 64, 66, 68. In the initial configuration, this third assembly 60 with four locks 62, 64, 66, 68 bears a key K9 for opening the door D4 allowing access to the area of the high-voltage part $P_{HT}$ of the container C, not shown, and captive in the lock 68, the locks 62, 64, 66 being free of any key and intended to receive, respectively:

two keys K7 and K8 freed after inactivation of the voltage breakers 70 and 72 present on the distribution cabinet 28 and able, in case of inactivation by rotation of the keys K7 and K8 in the locks 76A and 76B respectively associated with the voltage breakers 70 and 72, to prevent any powering on of the high-voltage part $P_{HT}$ of the container C.

the key K6 free to use in the absence of the key K1 in the lock 36 of the first assembly 30 (or base) (i.e., the door D5 for accessing the test zone $Z_T$ is open).

The key K9 for opening the door D4 is releasable only in the presence of the keys K6, K7 and K8, which corresponds to the absence of voltage test in progress, the door D5 for accessing the test zone $Z_T$ having been opened, combined with the powering off of the high-voltage part $P_{HT}$ of the container C.

The electrical distribution cabinet 28 further comprises two sets 74 of lighted indicators made up of three LEDs of different colors associated with the operation of the voltage breakers 70 and 72.

In other words, the high-voltage part $P_{HT}$ of the container C is only accessible when there is no test.

Thus, the system of keys implemented according to the invention to secure the test phases is based on a plurality of locks (and associated keys) distributed over at least two separate pieces of test equipment of the testing system, for example the pieces of test equipment corresponding to the control console 16, the grounding switch 18 of the test phases to be implemented, and the electrical distribution cabinet 28 of the container C as previously described.

According to the present invention, the aforementioned keys K0 to K9 are necessarily different so as to reinforce the security provided by the system of keys.

Figure 5:
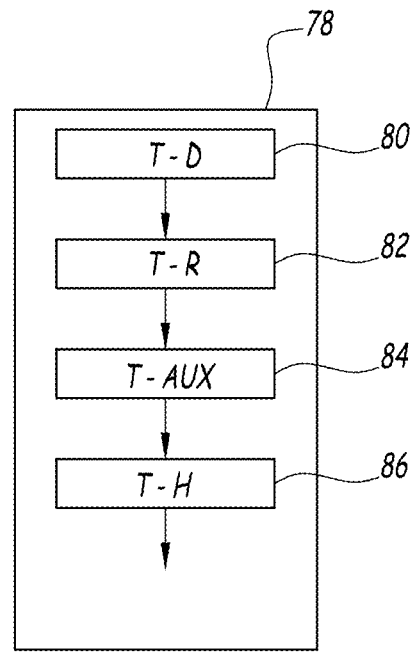

The railway traction block 11 testing method 78 will now be described in reference to FIG. 5, illustrating a flowchart of its steps carried out by the controller 12.

More specifically, the assembly formed by the test controller 12 and the test console 16, located in the first command part $P_C$ of the container C, is able to test the railway traction block 11, for example according to at least four successive separate test phases 80, 82, 84, 86 comprising a dielectric test phase 80 and the following successive voltage test phases 82, 84, 86:

low voltage 82, for example a low voltage between 24V-72V and 110V, auxiliary voltage 84, for example from 380 V to 480 V, high voltage 86, for example under voltages of 750 Vdc-1500 Vdc-3 KvDC-1000V/50 Hz and 1000V/16 Hz 2/3, each test phase being associated with a separate voltage supply source of the separate test zone $Z_T$, the high-voltage supply source(s) being located in the second high-voltage part $P_{HT}$ of the container C, in particular in the dedicated area of the second high-voltage part $P_{HT}$ accessible only through the door D4 secured by the system of keys previously described so that the person cannot enter when the second high-voltage part $P_{HT}$ is under voltage during the high-voltage test phase 86.

The test console 16 is first able to carry out the first dielectric test phase 80 (also called functional test phase) after charging, in particular by the door D6, of the traction block 11 to be tested in the test zone $Z_T$.

To that end, the operator first installs dielectric equipment on the traction block 11 to be tested so as to connect it via the hatch T to the dielectric station 14 of the first command part $P_C$ of the container C. Then, the operator closes the doors $D_5$ and $D_6$ of the test zone $Z_T$. According to one particular aspect, the doors $D_5$ and $D_6$ are equipped with closed-door detection contacts and the door $D_5$ is also locked using the key K1, which is then freed from the lock S1.

Once the test zone $Z_T$ is locked, the operator engages, on the test console 16, the power supply of the dielectric station 14, which enables the automatic injection of a voltage between 500 Vac and 10 KVac in order to measure the rigidity of the traction block 11 in terms of insulation/electrical continuity.

Then, once the dielectric test measurement is done, the test controller 12 is able to carry out the low-voltage test phase, also called low-voltage relay phase.

To that end, the operator first disconnects the dielectric station 14 previously used and connects the low-voltage power source located at the test controller 12, via the associated hatch T, using octopus cables, to the traction block 11.

Like for the previous test phase, the operator closes the access door $D_5$ to the test zone $Z_T$ and recovers the key K1 during closing, which requires checking that there is no one in the test zone $Z_T$.

The operator next engages this key K1 at the lock 36 of the first assembly 30 (or base) of at least four keys located in the command part $P_C$ of the container C. The placement of the key K1 is validated via the test controller 12.

The operator then begins the low-voltage relay tests. To that end, he engages a dedicated button of the test controller 12 and, if applicable, activates an associated terminal (i.e., computer) able to communicate with the test controller according to a test program capable of launching and executing, automatically via the test controller 12, the low-voltage and auxiliary test steps until the low-voltage 82 and auxiliary 84 test phases are completely carried out.

Once the low-voltage 82 and auxiliary 84 test phases are complete, the operator leaves the command part $P_C$ of the container C, enters the test zone $Z_T$ through the door $D_5$, which he unlocks using the key K1, disconnects the octopus cables (i.e., connectors) between the low-voltage and auxiliary sources of the command part $P_C$ and the traction block, then connects the high-voltage octopus cables of the container C (the octopus cables are connected to the container C via the hatches T across from the test equipment of the command part $P_C$ corresponding to the grounding switch of the test phases 18 able to activate/deactivate the voltage source(s) associated with each test phase, and corresponding to the interface cabinet 20 with the traction block) to the traction block 11 being tested.

Once the connections are done, the operator closes the door $D_5$ of the test zone $Z_T$, then recovers the key K1 (also called platform securing), then returns to the command part $P_C$ of the container C.

In the command part $P_C$ of the container, the operator inserts the key K1 into the lock 36 of the first lock assembly 30, then, as previously described in connection with the system of keys according to the present invention, the operator recovers, on the first assembly 30, the second key K2 freed in the lock 34, the key K2 being necessary for unlocking on the grounding switch of the test phases 18 of the first high-voltage power source activation security switch 40, the position change of which frees the third key K3 for unlocking the fourth key K4 borne by the second lock assembly 46, the fourth key K4 being connected to the fifth key K5 for validating the command of the test controller 12 activating the high-voltage source located in the second high-voltage part $P_{HT}$ of the container C inaccessible during testing.

Once the actions are performed, the operator launches the automatic program of the high-voltage test phase 86 from the test controller 12, which performs the high-voltage tests step by step. Once the program is complete, the operator recovers an automatic test report published by the test controller 12.

Once the report is recovered, the operator puts the first switch 40 back in "ground" (or electric ground connection) mode, then recovers the keys making it possible to open the test zone in order to disconnect the traction block 11 being tested.

Once the final verifications are done and the product is disconnected, the tester takes the product out of the test zone $Z_T$ through the door $D_6$, or if the testing system 10 is installed on a production line L, advances the conveyor belt of the production line L to test the following traction block $11_S$.

Thus, according to the testing method 78 of the invention, the test controller 12 is capable of triggering each test phase after detecting the closing of the door(s) $D_5$ of the test zone $Z_T$, such closing authorizing the activation of the associated voltage supply source, the closing of the operator access door $D_5$ of the test zone $Z_T$ making it possible to release the key K1 necessary for the validation by the controller of the triggering of the voltage test phases.

In other words, the testing method 78 implemented within the system according to the present invention is secured for each test phase 80, 82, 84, 86 by a system of keys comprising a plurality of locks distributed over at least two separate pieces of test equipment of the testing system.

One can thus see that the present invention proposes a system 10 for testing a railway traction block that is both transferable between two different operating sites without requiring new certification upon each transfer and allows the secure implementation of all of the electrical test phases, including a high-voltage test phase.

What is claimed is:

1. A system for testing a traction block, comprising two zones that are physically separated from one another:
   an operational zone located in a container and divided into at least two parts:
      a first command part accessible by an operator during testing,
      a second high-voltage part completely inside the container and inaccessible during testing, said second high-voltage part comprising an operator access door,
   a test zone, located outside the container, configured to receive the traction block to be tested, and said test zone comprising at least one operator access door,
   the test zone being able to be supplied with electricity during the test by the operational zone using dedicated connections, the operator access door of the second high-voltage part completely inside the container and the at least one operator access door of the test zone being secured during testing.

2. The testing system according to claim 1, wherein the second high-voltage part comprises at least one gate capable of supporting the fastening of high-voltage equipment comprising at least a plurality of separate supply voltage sources.

3. The testing system according to claim 1, wherein the container comprises at least one system for regulating the temperature.

4. The testing system according to claim 1, further comprising a device for protecting the test zone, comprising a plurality of partitions and/or a plurality of virtual safety barriers.

5. The testing system according to claim 1, wherein the test zone comprises a portion of a traction block production line, the portion being capable of supporting the traction block.

6. The testing system according to claim 1, wherein the at least one operator access door of the test zone is secured during testing by locking.

7. A system for testing a traction block comprising two zones that are physically separated from one another:
   an operational zone located in a container and divided into at least two parts:
      a first command part accessible by an operator during testing,
      a second high-voltage part and inaccessible during testing,
   a test zone, located outside the container, and configured to receive the traction block to be tested,
   the test zone being able to be supplied with electricity during the test by the operational zone using dedicated connections,
   wherein the first command part comprises a testing controller capable of testing the traction block according to at least four successive separate test phases comprising a dielectric test phase and the following voltage test phases:
   low voltage,
   auxiliary voltage, and
   high voltage,
   each test phase being associated with a voltage supply source of the separate test zone, each supply source delivering a high voltage being located in the second high-voltage part of the container.

8. The testing system according to claim 7, wherein the testing controller is capable of triggering each test phase after detecting the closing of the door(s) of the test zone authorizing the activation of the associated voltage supply source, the closing of the operator access door of the test zone making it possible to release a first key necessary for the validation by the testing controller of the triggering of the voltage test phases.

9. The testing system according to claim 8, wherein, to trigger the high-voltage test phase, the first key is necessary to unlock a second key supported by a first set of locks located in the first command part of the operational zone, the second key is necessary to unlock a first safety switch for activating the high-voltage supply source, the position change of which releases a third key for unlocking a fourth key supported by a second set of keys, the fourth key being connected to a fifth key for validating the command of the testing controller activating the high-voltage source located in the second high-voltage part that is inaccessible during testing.

10. The testing system according to claim 9, wherein the first set of keys bears, on one of its locks, a sixth key free to use in the absence of the first key on the associated lock of the first set of locks,
   and wherein the testing system comprises a third set of locks located on the electrical distribution cabinet of the second high-voltage part of the container comprising at least three doors, at least one of which allows access to an electrical cabinet, and two of which are interleaved, with different sizes and allowing access to the space of the high-voltage part of the container comprising the sources and/or voltage supply charges, said container comprising four locks, including:
- a lock dedicated to the sixth key,
- two other locks from the third set of locks being dedicated to a seventh and an eighth key able to be obtained respectively after actuating two voltage breakers in the inactive position of the distribution cabinet, and
- a fourth lock in which a ninth key is inserted and able to be released only in the presence of the sixth, seventh and eighth keys, the ninth key being able to open the smallest of the two interleaved portions for accessing the space of the high-voltage part of the container comprising the voltage supply sources.

11. A system for testing a traction block comprising two zones that are physically
separated from one another:
- an operational zone located in a container and divided into at least two parts:
  - a first command part accessible by an operator during testing,
  - a second high-voltage part and inaccessible during testing,
- a test zone, located outside the container, and configured to receive the traction block to be tested,
- the test zone being able to be supplied with electricity during the test by the operational zone using dedicated connections,
- wherein the container comprises at least four separate operator access doors, the first command part comprising at least one door, the second high-voltage part of the container comprising at least three doors, at least one of which allows access to an electrical cabinet, and two of which are interleaved, with different sizes and allowing access to the space of the high-voltage part of the container comprising the sources and/or voltage supply charges, and wherein the test zone comprises at least one operator access door, at least one access door of the testing system being secured by a system of keys comprising a plurality of locks distributed over at least two separate pieces of test equipment of the testing system.

* * * * *